United States Patent [19]
Kehley et al.

[11] Patent Number: 5,919,050
[45] Date of Patent: Jul. 6, 1999

[54] METHOD AND APPARATUS FOR SEPARABLE INTERCONNECTING ELECTRONIC COMPONENTS

[75] Inventors: Glenn Lee Kehley, Endicott, N.Y.; Glenn Edward Myrto, Holly Springs, N.C.; John Henry Sherman, Lisle, N.Y.

[73] Assignee: International Business Machines Corporation, Armonk, N.Y.

[21] Appl. No.: 08/834,064

[22] Filed: Apr. 14, 1997

[51] Int. Cl.$^6$ ..................................................... H01R 9/09
[52] U.S. Cl. ................................ 439/71; 439/526; 439/66
[58] Field of Search ................................ 439/71, 73, 331, 439/66, 526

[56] References Cited

U.S. PATENT DOCUMENTS

| | | | |
|---|---|---|---|
| 4,164,003 | 8/1979 | Cutchaw | 439/331 |
| 4,376,560 | 3/1983 | Olsson et al. | 439/331 |
| 4,554,505 | 11/1985 | Zachry | 439/331 |
| 4,830,623 | 5/1989 | Owens et al. | 439/71 |
| 4,832,612 | 5/1989 | Grabbe et al. | 439/71 |
| 4,933,808 | 6/1990 | Horton et al. | 439/73 |
| 4,943,242 | 7/1990 | Frankeny et al. | 439/65 |
| 5,037,311 | 8/1991 | Frankeny et al. | 439/66 |
| 5,099,393 | 3/1992 | Bentlage et al. | 439/73 |
| 5,163,834 | 11/1992 | Chapin et al. | 439/66 |
| 5,248,262 | 9/1993 | Busacco et al. | 439/66 |
| 5,262,925 | 11/1993 | Matta et al. | 439/73 |
| 5,397,245 | 3/1995 | Roebuck et al. | 439/71 |
| 5,413,489 | 5/1995 | Switky | 439/71 |
| 5,426,405 | 6/1995 | Miller et al. | 333/247 |
| 5,468,158 | 11/1995 | Roebuck et al. | 439/73 |
| 5,653,600 | 8/1997 | Ollivier | 439/71 |
| 5,730,620 | 3/1998 | Chan et al. | 439/526 |

OTHER PUBLICATIONS

DieMate from Texas Instruments A Bare Die Burn–in & Test Interconnect System—Texas Instruments 1994.
IBM Microelectronics CBeam™ Connector 1995.

Primary Examiner—Steven L. Stephan
Assistant Examiner—T C Patel
Attorney, Agent, or Firm—Calfee, Halter & Griswold LLP

[57] ABSTRACT

A socket connects electronic components such as integrated circuit modules with arrays of solder balls or columns, lands, pads of similar contacts to other components, typically substrates such as printed circuit boards. The socket has a polarization post and locator posts that extend through polarization and locator holes in the substrate and in a registration sheet that locates the module with respect to the substrate. The heads of the posts, which are all substantially the same size, extend through arcuate slots in a cam ring. Each of the slots has an inclined ramp that engages the heads of the post. When the cam ring is turned, the heads of the posts ride up the ramps, moving the cam ring towards the substrate and compressing a wave spring that presses against a pressure plate. The pressure plate in turn presses the module toward the substrate, providing a secure yet separable electrical connection between the contacts in the array on the module and contacts on the substrate, preferably through an electrical interposer positioned between the module and the substrate.

17 Claims, 5 Drawing Sheets

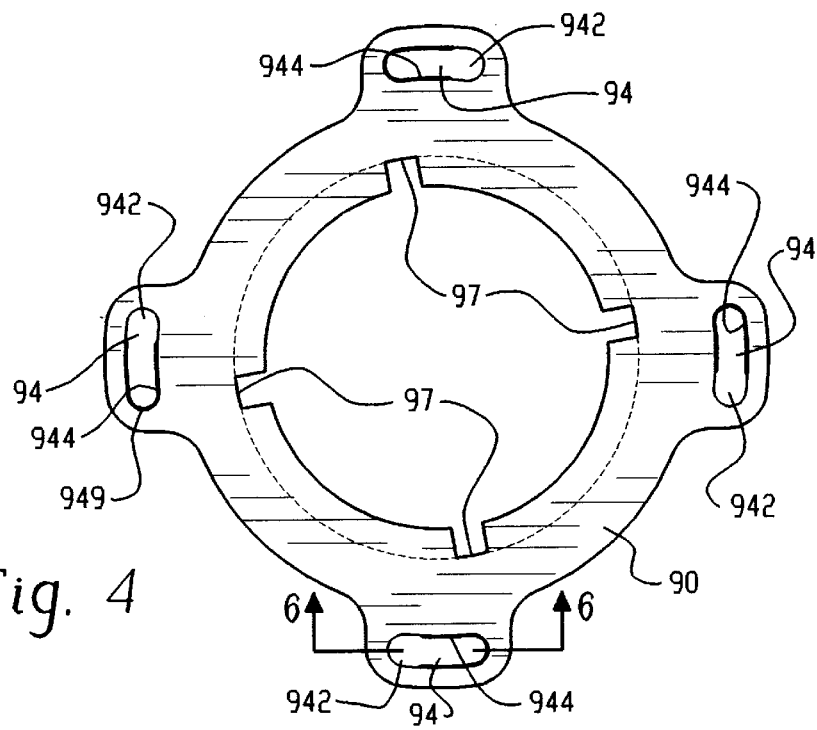
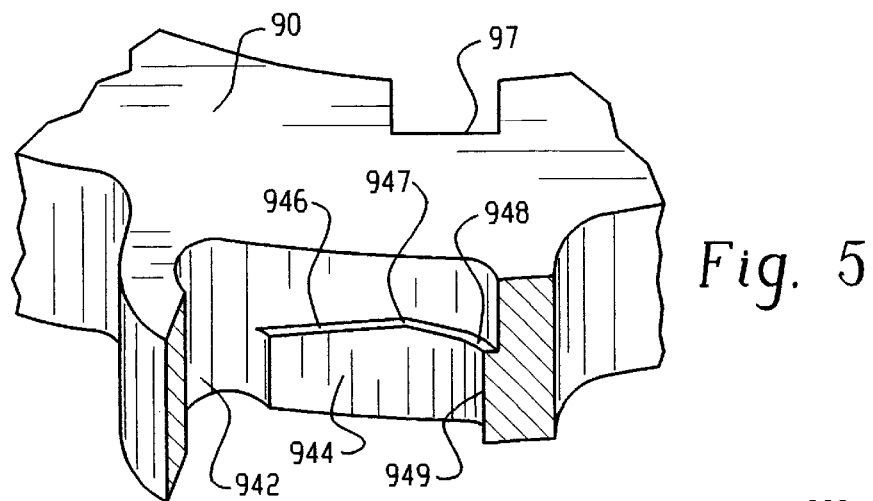
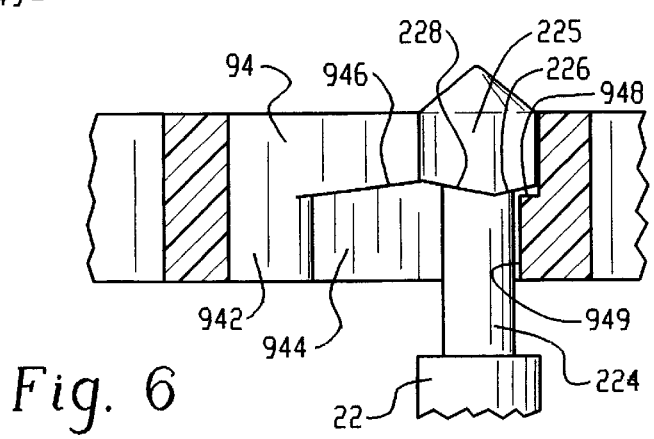

METHOD AND APPARATUS FOR SEPARABLE INTERCONNECTING ELECTRONIC COMPONENTS

FIELD OF THE INVENTION

This invention relates to the field of electrical connectors. More particularly, it relates to a method and apparatus for separably connecting electronic components such as integrated circuit chips or modules, with arrays of contacts such as solder balls or columns, lands or pads to substrates such as printed circuit boards or other carriers.

BACKGROUND OF THE INVENTION

With the continuing trend towards miniaturization of electrical systems such as information handling systems (computers), set top boxes, automotive computers and the like, the margin of error for connecting components in these systems continues to decrease. As the pitch of the array tightens, i.e. as the distances between balls decreases, the tolerances for misalignment get smaller and the risk of connections to incorrect pads gets bigger.

The trend of interconnection technology is towards connectors, referred to respectively as ball grid arrays (BGA) and column grid arrays (CGA), that use arrays of small balls or columns, typically of 90/10 solder, i.e. solder that is 90% tin and 10% lead. The balls or columns are attached to contact pads on the module with lower melting temperature solder, typically 63/37 solder (63% tin and 37% lead). The module, with balls or columns attached, is positioned so that the balls or columns contact pads or other conductors on the surface of another electrical component, such as a printed circuit board, a chip carrier that is connected to a printed circuit board, or another module. The pads on the other component will also have solder paste, usually 63/37 solder, screened on to accept the module. Typically, the assembly is then heated to melt the solder paste and bond the two components together. With this type of attachment, the module is located and held by the reflowed 63/37 solder.

The process of soldering a module to a PC Board or carrier stresses both components of the assembly. Post assembly requirements such as repairs, replacements and upgrades further stress both components, and other nearby components as well. In addition, soldering complicates field repairs, upgrades and other replacements. With solder connections, field replacements must usually be complete assemblies. Where this is not possible or desirable, factory repairs are required.

In some systems, typically testing apparatus, solder balls or columns are simply pressed against pads on another component or interconnect device. Similar unsoldered mechanical connections are made in land grid array or pad-on-pad connections. These unsoldered mechanical connections, with arrays of balls, columns, lands, pads or other contacts pressed against other contacts, are referred to herein as "contact array connections." The arrays of balls, columns, lands, pads or other contacts are referred to as "contact arrays" or "arrays of contacts."

U.S. Pat. No. 5,468,158 to Roebuck et al discloses a system for mechanically connecting integrated circuit chips or dies with peripheral array connectors to a burn-in test board so that the chips can be tested or burned in to produce "known good die." The chips are mounted on a substrate with conductive traces ending in bumps that contact pads on the bottom surface of the chip. Visual positioning equipment is used to place and align chip or die on the substrate. Optical alignment marks are provided on the substrate for that purpose.

The die is pressed against a substrate by a lid, which is pressed against the upper surface of the die (or against an intervening electrical biasing clip) by a spring. The spring is compressed by one of several mechanisms or systems that connect to two posts extending upwardly from the substrate. One of these mechanisms comprises a rotary latch assembly with two ramps having openings through which heads of the posts are inserted. As the latch assembly is rotated the heads of the post move up the ramps, compressing the spring and pressing the die against the substrate.

This entire subassembly is then inserted into a socket subassembly with pins that are inserted into holes in the burn-in test board. The socket assembly includes a cover with means to enlarge an opening for the substrate assembly and die, so that pads on the periphery of the thin film interconnect (substrate) can contact electrical connectors in the base of the socket.

The Roebuck system is bulky and complicated, and is primarily for laboratory/factory test applications. Most of the embodiments require tools for assembly. The ramps on the rotary latch version are subject to wear and binding because the heads of the mounting post make line contact with the ramps.

The two post mounting system and centrally located coil spring press against the center of the die. Forces are not evenly distributed. With manufacturing variations and other irregularities, the die may tip and wobble and fail to make good electrical contact with some of the contacts in the peripheral array.

The peripheral array limits the number of available contacts. It is not readily apparent how this system could be adapted to ball grid arrays or column grid arrays which, because of the much larger number of available contacts that can be provided within a given surface area, are becoming the connector of choice for the electronics industry.

SUMMARY OF THE INVENTION

This invention provides an electrical interconnect assembly or socket for connecting electronic components such as integrated circuit modules with contact arrays to other components, typically substrates or carriers such as printed circuit boards or cards. While primarily intended for systems in which contacts are distributed over a surface or area of a module, substrate or other component, commonly referred to as "area arrays", the invention may also be used with other contact arrays, such as peripheral arrays. The socket includes a registration sheet having a central opening and contact capture openings in the frame around the opening, and a cam ring adapted to compress a spring, preferably an annular wave spring, against a pressure plate. The pressure plate presses the IC module towards the carrier. The socket is assembled upon a base having posts that extend through holes in the carrier, through holes in the registration sheet, and through slots in the cam ring. The posts are positioned about the periphery of the IC module. Thus, the cam ring and the annular wave spring can exert a force on the surface of the pressure plate, and over substantially the entire upper surface of the IC module. This helps insure that good electrical connections are made with all of the balls, columns, lands, pads or other contacts in the array.

The slots in the cam ring have ramps that engage heads on the posts. As the cam ring is rotated, the heads of the posts ride up these ramps, forcing the cam ring down, compressing the annular wave spring and pressing the pressure plate against the IC module.

In a preferred embodiment of the invention, each cam ring slot has two ramps: an actuation ramp sloping upwardly to an apex and a locking ramp which slopes downwardly from the apex to one end of the slot. As the head of a post, which has two ramps that compliment the actuation and locking ramps of the slot, moves past the apex and down the locking ramp, the cam ring is secured in position.

Preferably, each of the posts has a base, a neck and a head, and the base of one of the posts is larger than the others. The larger post functions as a polarization post. The corresponding holes in the carrier and the registration sheet are also larger than the other holes. The registration sheet also includes features which mean that the IC module can only be assembled with the registration sheet in one position or, in terminology frequently used in the electronics industry, the parts are "polarized". This means that the IC module and the PC board or other carrier are always correctly aligned. Typically, the base, carrier, registration sheet and module have chamfered corners, marks, or other indicia to facilitate correct assembly.

The preferred embodiment also includes an electrical interposer between the PC carrier and IC module. The interposer can compensate for lack of planarity, dimensional variations and other manufacturing imperfections and reduces wear and tear on the solder balls or columns.

Because of the large number of connections, the socket of this invention can accept a wide variety of modules with contact array connections. It is much more adaptable than the Roebuck et al system, which does not lend itself to customization in this manner. In addition, since the socket of this invention is more compact and less complex, it is more suitable for permanent installations. The even, consistent pressure developed by the wave spring of this invention, which remains consistent for extended periods of time, also promotes use in permanent installations.

The socket is also suitable for "kitting." The socket can be kitted as a whole assembly, including the module, to be assembled by manufacturer, reseller or end user. The system can also be separated into two different kits. The first kit may be composed of the base, registration sheet and interposer. This kit is used by plants that assemble the PC boards, cards or other carriers to preassemble these components. The second kit may be made up of the cam ring, compression spring and pressure plate. This kit is used to customize the carrier subassembly with an appropriate module at the time of customer order, or sold as a separate kit to a customer for upgrading an existing carrier/module assembly.

Other features and advantages of this invention will be apparent from the following detailed description.

DRAWINGS

FIG. 4 is a plan view of the cam ring in FIG. 1.

FIG. 5 is a fragmentary perspective view of a slot in the cam ring in FIG. 4.

FIG. 6 is a cross sectional view along lines 6—6 of FIG. 4.

DETAILED DESCRIPTION

Figure 1:
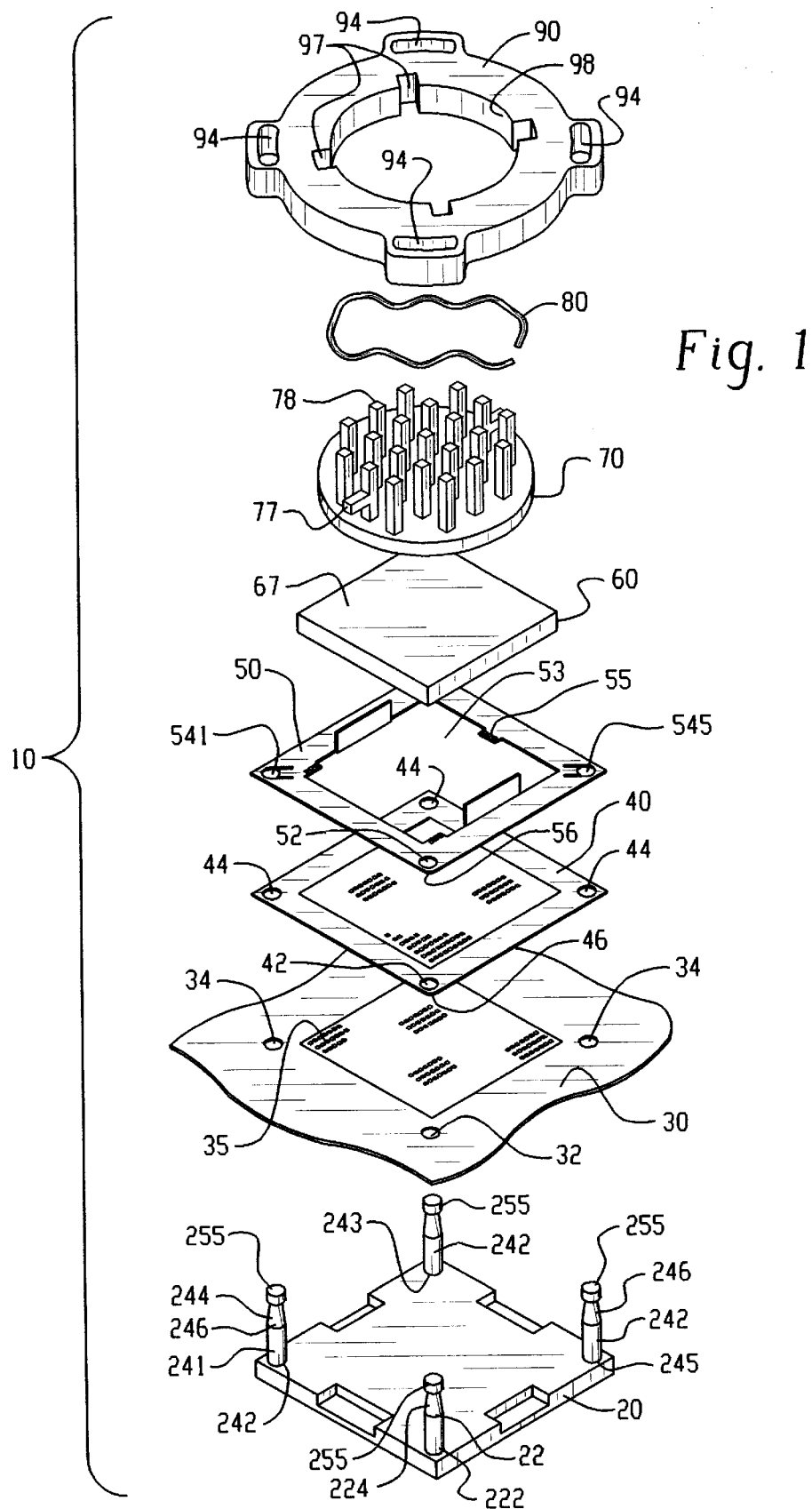
FIG. 1 is an exploded perspective view of one embodiment of this invention.
Figure 2:
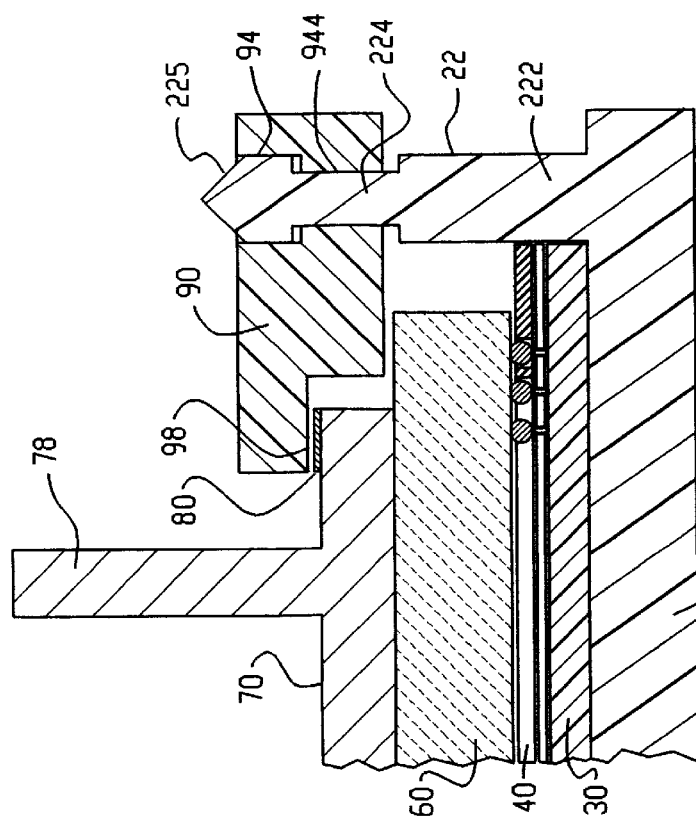
FIG. 2 is a partial cross sectional elevation view of the socket shown in FIG. 1, when assembled.
Figure 11:
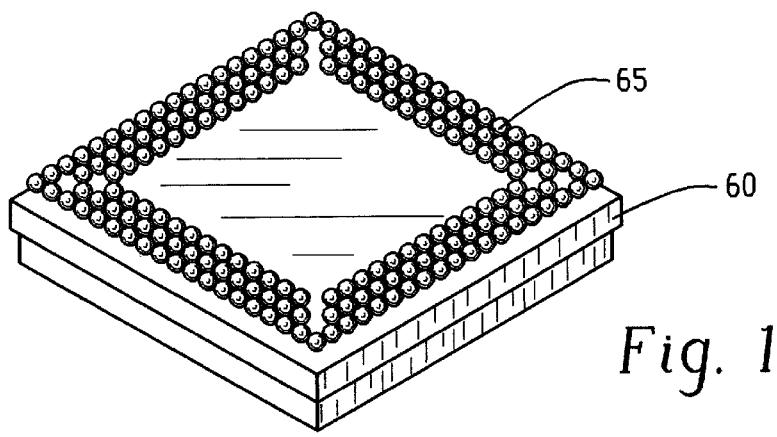
FIG. 11 is a perspective view of the IC module shown in FIG. 1, turned upside down to illustrate some of the solder balls on the bottom surface of the module.

FIGS. 1 and 2 illustrate an electrical interconnect assembly or socket 10 embodying this invention. Socket 10 connects an integrated circuit chip module 60 to contact pads 35 (but seen in FIGS. 7, 8 and 9) on a substrate 30, such as a printed circuit board or card, which comprises one element of the socket. As shown in FIG. 11, in which module 60 is turned upside down, this embodiment has an array of solder balls 65 on the bottom of the module. However, the socket is also suitable for arrays of other contacts such as solder columns, lands or pads.

When the illustrated components are assembled, the solder balls or columns on the module are pressed against contact pads (described in more detail below) on an electrical interposer 40. The electrical interposer connects the solder balls 65 or other contacts, and through them the IC chip or chips within module 60, to the PCB contact pads 35.

The socket also includes a base 20 with a registration or polarization post 22 and three locator posts 241, 243, 245. The posts extend, respectively, through a polarization hole 32 and three locator holes 34 (one of which is hidden in FIG. 1) in the PCB 30. Above the PCB the polarization post and locator posts extend through a polarization hole 42 and three locator holes 44 in an electrical interposer 40, through a polarization hole 52 and three locator holes 541, 543 (hidden in FIG. 1) and 545 in a module registration sheet 50, and through four actuation slots 94 in a cam ring 90. The base 222 of the polarization post 22 is larger than the bases 242 of locator posts 241, 243 and 245. This ensures that PCB 30, interposer 40, and registration sheet 50, which controls the position of the module 60, are oriented correctly with respect to each other. The electrical interposer and registration sheet have chamfered corners 46, 56 adjacent to the polarization holes to facilitate orientation and assembly of these components. The module has a mark 67 at the corner to be located at the polarization post 22. Preferably, the carrier is provided with a mark, which may be made by such screening or other conventional techniques, near polarization hole 32, and polarization post 22 is marked in a similar manner.

A pressure plate 70 (the illustrated plate also functions as a heat sink) and compensating wave spring 80 are positioned between the cam ring 90 and the IC module 60. The illustrated wave spring is an annular metal ring having a serpentine cross-section in the radial direction. In other words, the spring consists of a series of alternating curves with the outside or convex surfaces of the curves defining the top and bottom of the spring. As may be seen in FIG. 1, the ring is adapted to contact cam ring 90 and pressure plate 70 at a plurality of locations around the ring. Typically, the spring will be sinusoidal, but other forms of curves that provide the desired flexibility and biasing force are possible.

As shown in FIG. 2, the wave spring 80 is compressed by an inwardly extending lip 98 on cam ring 90 and presses against the pressure plate 70. The pressure plate in turn presses the IC module 60 against the interposer 40 with the desired pressure for actuation, which is dependant upon the type of interposer and the components' electrical interface, number of contacts, and mating area. The actuation force may be changed by substituting a spring with a different spring rate.

Figure 12:
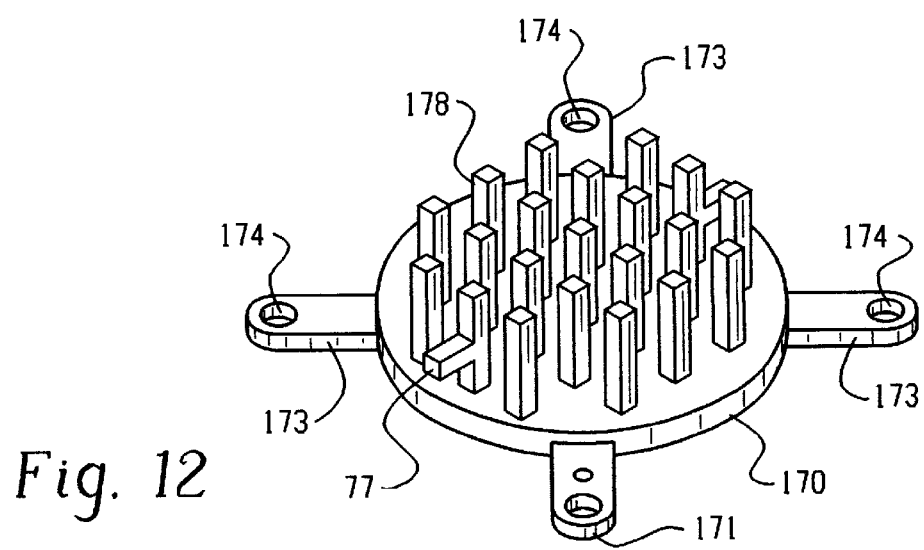
FIG. 12 is an enlarged perspective view of an alternative pressure plate/heat sink.

Pressure plate 70, and the alternative pressure plate 170 shown in FIG. 12, are preferably provided with protruding fins or rods 78, 178 to help dissipate heat generated by the IC chip or chips within the module 60. A locking tab 77, 177 may be provided on one of the protruding rods 78, 178, or on the pressure plate itself. The locking tabs 77, 177 are designed to fit in one of four locking notches 97 in the lip 98 of cam ring 90, and can be used to secure the pressure plate 70, wave spring 80 and cam ring 90 together as a subassembly to facilitate assembly of the overall socket. Alternatively, as shown in FIG. 12, a pressure plate 170 may be provided with a polarization arm 171 and three locator arms 173, with a polarization hole 172 and three locator holes 174 so that the pressure plate 170 may be located in a desired orientation with respect to the module 60, registration sheet 50, interposer 40, carrier 30 and base 20.

Figure 3:
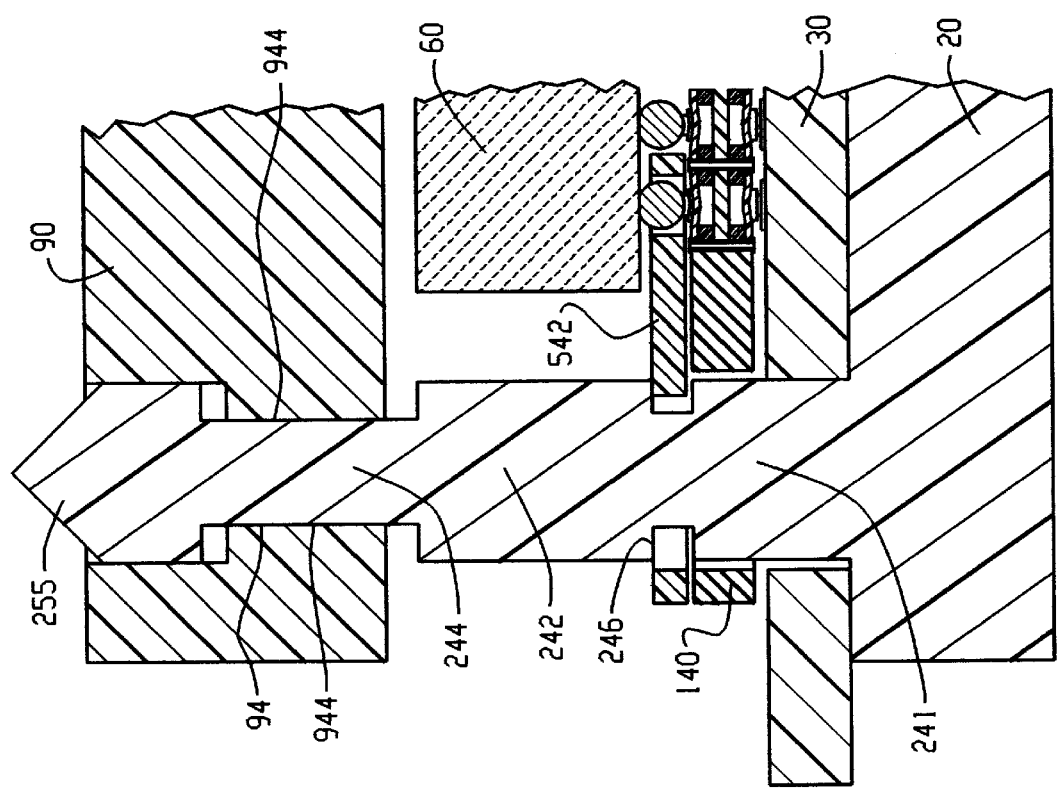
FIG. 3 is an enlarged fragmentary view of a socket like the one shown in FIGS. 1 and 2, but with a different electrical interposer.

The relationship between cam ring 90 and the locator posts 241, 243, 245 and polarization post 22 may be seen in FIGS. 2, 3 and 6. Details of the slots 94 in the cam ring may be seen in FIGS. 4, 5 and 6. As shown in FIGS. 4 and 5, each of the cam ring slots 94 has an open hole 942 at one end that allows the cam ring to slip down over either the polarization post or the locator posts. Unlike the base 222 of the polarization post 22 which, as noted above, is larger than the bases 242 of the locator posts, the neck 224 and head 225 of the polarization post are the same size as the necks 244 and heads 255 of locator posts 241, 243 and 245. This simplifies manufacture and facilitates assembly.

Each of the slots 94 has a U-shaped shoulder 944 extending counterclockwise from open hole 942 (as viewed in the plan view of FIG. 4). Each shoulder 944 is divided into two ramps (best seen in FIG. 5), an upwardly inclined or actuating ramp 946 which leads upwardly from the open hole to an apex 947, and a downwardly inclined locking ramp 948 which extends from apex 947 to the closed end 949 of the slot. As shown in FIGS. 2 and 3, the channels between the opposite sides of the U-shaped shoulders 944 are wide enough so that the neck 224 of the polarization post (FIG. 2) and the necks 244 of the locator posts (FIG. 3) can fit between the shoulders, yet narrower than the heads 225, 255 of the polarization and locator posts. The necks 224, 244 of the polarization and locator posts are undercut beneath the heads 225, 255, making the heads 225, 255 of the posts larger than the necks 224, 244. Thus, as the cam ring is turned clockwise, the head of the polarization post or locator post in each slot rides up the inclined actuator ramp 946 until it reaches apex 947. From there, the head slides down the locking ramp 948 to the closed end of the slot 949 As best shown in FIG. 6, the head 225 of the polarization post 22 has an actuation or biasing ramp 226 and a locking ramp 228 which match the ramps in the cam ring slots. (The heads 245 of the locator posts have comparable ramps.) These ramps provide bearing surfaces that reduce wear on the heads and ramps.

As the heads 225, 255 of the posts ride up the actuator ramps 946 in the cam ring, the cam ring is pressed towards the base and compresses the compensation spring 80 against pressure plate 70, as shown in FIG. 2, which presses the IC module 60 against the electrical interposer 40. Continued clockwise rotation of the cam ring after the heads of the posts pass apices 947 lets the locking ramps on the post heads slide down the locking ramps 948 on the shoulders to the closed ends 949 of the slots. With the posts at the closed ends of the slots, the cam ring cannot be removed without being depressed slightly, and the cam ring is locked in place. The cam ring and posts are designed to provide the desired deflection of the compensation spring when the cam ring is rotated to the locked position.

Compensation spring 80 performs several functions. The first, of course, is to exert pressure on the pressure plate and thereby on the IC module. The spring also compensates for dimensional variations, due primarily to manufacturing tolerances, of the various components of the system. Another extremely important benefit of having the illustrated metal wave spring in the system is the effect on mating force over the life of the connection. The spring applies a continuous force normal to the contact surfaces, which does not significantly diminish over time due to relaxation (creep) as a result of environmental influences (such as temperature, humidity, air-flow and the like).

Module 60 is held in position with respect to interposer 40 and PCB 30 by a registration sheet 50 (shown in FIGS. 1 and 10) having a central opening 53, and ball capture holes 55 (best seen in FIG. 10) in the frame 51 adjacent to the central opening. Some of the balls 65 on the outside of the array on the module are held in place by the ball capture holes. This ensures that the balls are in registry with the contact pads on the interposer.

If the module has a solder ball or column missing at the polarization corner, the registration sheet may have a positive feature such as a dimple or other physical feature to discern orientation at this corner.

Figure 10:
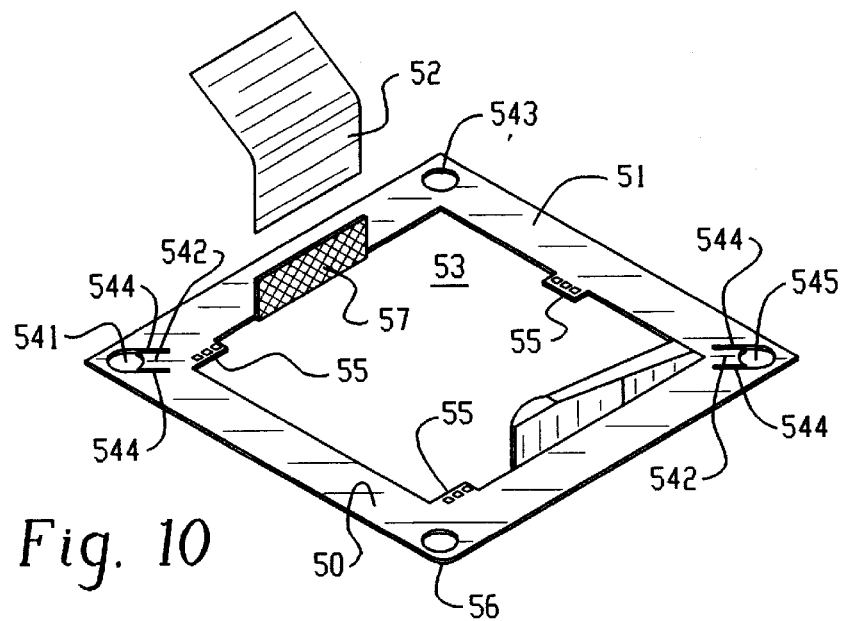
FIG. 10 is an enlarged perspective view of the component registration sheet shown in FIG. 1.

As best seen in FIG. 10, the locator holes 541, 545 on each side of polarization hole 52 each have a pair of tangential slots 544 extending from the hole toward the center of the registration sheet. These slots 544 define locking keys 542 which may be used to secure the registration sheet 50, base 20, carrier 30 and electrical interposer 40 together. This may be desirable, for example, when these components are preassembled as a kit to await selection of an IC module.

As shown in FIG. 1, and more clearly in FIG. 3, each of the two locator posts 241, 245 adjacent to the polarization post 22 has an annular locking groove 246. When the components are assembled, as shown in FIG. 3, the locking tabs 542 on the registration sheet 50 drop into the locking grooves 246, and hold the subassembly together. The registration sheet is held securely in place, but can be removed readily by deflecting the split tab of the registration sheet allowing it to be removed from the locking slot. The tabs must be deflected in order to remove the entire registration sheet. Thus, this feature readily accommodates both kitting or preassembly of the components and subsequent repairs, modifications or other operations.

Another method of polarization using the registration sheet is one that does not use a missing ball as the registration feature. In this method, the sheet is attached to the module, holding the module in the correct orientation and position. As best seen in FIG. 10, the sheet has adhesive covered tabs 57, which are covered by a release liner or pull tab 58 until the module 60 is to be attached to the registration sheet 50. When the pull tabs 58 are removed, the module can be asserted in the registration sheet, with the proper balls 65 in the ball capture openings 55. The adhesive tabs hold the module in place so that the module and registration sheet can be connected to base 20 as one unit. This method produces a mechanical polarization and does not require a visual inspection of correct placement after the module and registration sheet have been preassembled.

Figure 7:
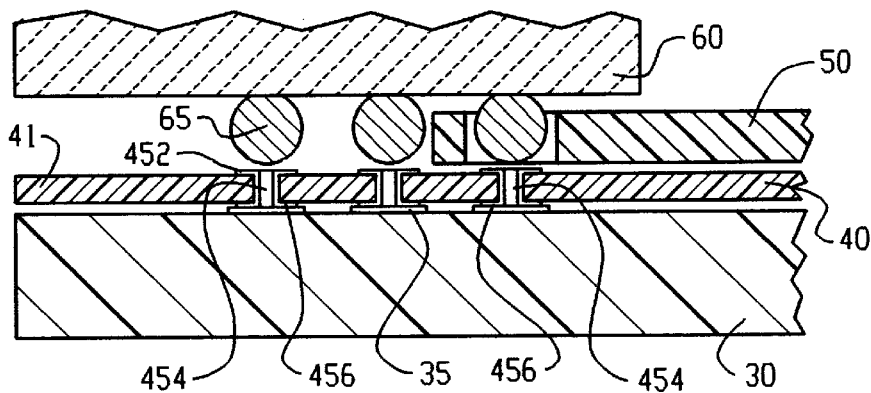
FIG. 7 is an enlarged cross sectional view of the electrical interposer shown in FIGS. 1 and 2.

When the components shown in FIG. 1 have been assembled, the solder balls 65 on the bottom of IC module 60 press against contact pads 452 on electrical interposer 40, illustrated in FIG. 1, FIG. 2 and in more detail in FIG. 7. As best seen in FIG. 7, the electrical interposer in this embodiment comprises a thin sheet of a dielectric material 41, with electrically conductive vias 454 extending through the sheet between contact pads 452, on the top of the sheet, and contact pads 456 on the bottom of the sheet. The solder balls on the IC module are pressed against the upper contact pads 452 and the lower contact pads 456 are pressed against the contact pads 35 on the PC board 30.

Figure 8:
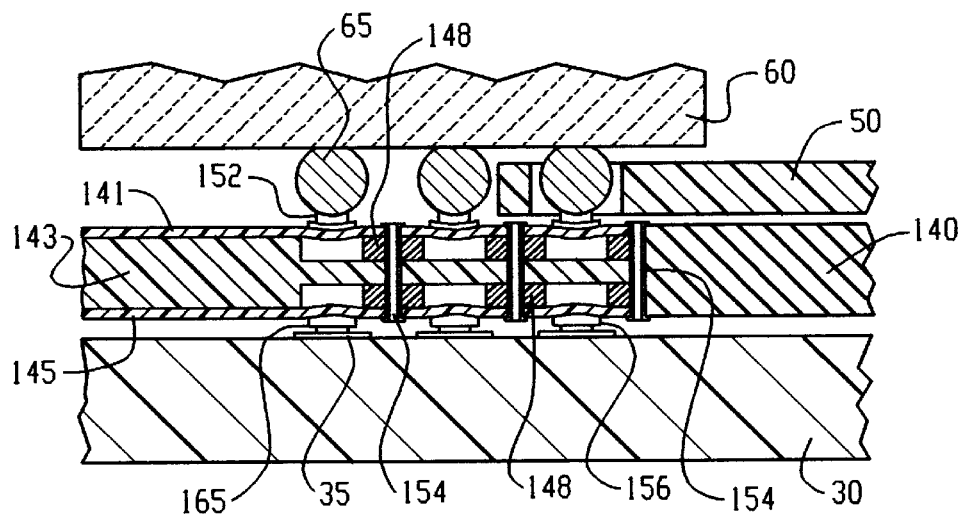
FIG. 8 is an enlarged cross sectional view of the electrical interposer shown in FIG. 3.

FIGS. 3 and 8 illustrate an alternate form of interposer 140 which will accommodate greater irregularities in the solder balls and/or PC board contact pads. The central region of the interposer has three spaced sheets 141, 143, 145 of a dielectric material such as glass filled epoxy. The solder balls on the IC module are pressed against contact pads 152 on the upper sheet 141, and contact pads 156 on the lower sheet 145 are pressed against the contact pads 35 on the PC board 30. Thus, short, direct electrical connections are made between the solder balls 65 through the upper contact pads 452, vias 454 and lower contact pads 456 of the interposer to the contact pads 35 on the PC board. The upper sheet and lower sheet are separated from the central sheet 143 by spacers 148. These spacers are positioned between (i.e., not aligned with) the contact pads in order to insure maximum compliance. Vias 154 extend through the sheets and spacers, connecting contact pads 152 on the upper sheet to contact pads 156 on the lower sheet.

Figure 9:
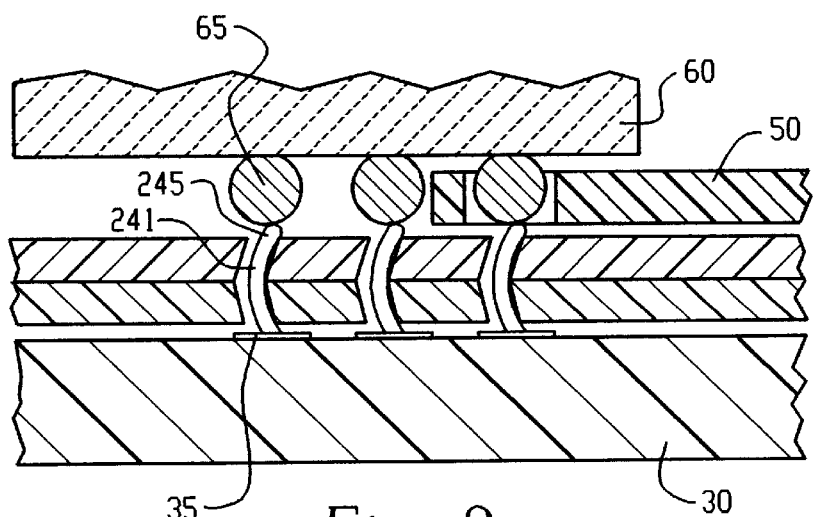
FIG. 9 is an enlarged cross sectional view of yet another electrical interposer suitable for use in the sockets of this invention.

The buckling beam interposer illustrated in FIG. 9 provides another alternative for the sockets of this invention. These interposers have flexible beams 241 of dielectric material, with each beam supporting a number of conductive strips 245 that connect the solder balls 65 to the PCB contact pads 35. U.S. Pat. Nos. 4,943,242 and 5,037,311 to Frankeny et al.; 5,163,834 to Chapin et al and 5,248,262 to Bussaco et al, the disclosures of which are incorporated herein by reference, provide further disclosures of buckling beam interposers.

As those skilled in the art will readily appreciate, other interposers may be equally well suited for particular applications. These are but a few of many modifications that may be made to the electrical interconnect assemblies, sockets and methods within the scope of this invention, as defined in the following claims. Like the embodiments disclosed herein, these modifications provide assemblies, sockets and methods that are compact, easy to use and accommodate the vast majority of IC modules with contact arrays without major adaption or specialization.

We claim:

1. An electrical interconnect assembly comprising:
   an integrated circuit module having an array of module contacts distributed over a surface of said module;
   a substrate having an array of substrate contacts distributed over a surface of said substrate, and having a plurality of substrate locator holes extending through the substrate;
   an electrical interposer, having a first array of contacts distributed over a first surface of said interposer and a second array of contacts distributed over a second surface of said interposer opposite said first surface, with contacts in said first array being substantially aligned with and electrically connected directly through said interposer to contacts in said second array, said interposer being positioned between said integrated circuit module and said substrate;
   a registration sheet adapted to position said integrated circuit module and having module locator holes extending through the sheet;
   a base adapted to support said substrate, with said substrate positioned between said base and said interposer, said base having posts that extend through said substrate locator holes, through said interposer locator holes and through said module locator holes, and position said substrate, interposer and registration sheet so that contacts on said module are substantially aligned with contacts in said first array of interposer contacts and contacts in said second array of interposer contacts are substantially aligned with contacts on said substrate;
   a pressure member adapted to press said module toward said printed circuit board of card;
   a wave spring comprising a metallic annular ring having a serpentine radial cross-section and adapted to exert pressure on said pressure member at a plurality of locations around said ring, and adapted to compensate for dimensional variations and deviations from planarity; and
   a cam member adapted to contact said annular ring at a plurality of locations around said ring, said cam member having arcuate openings with inclined ramps adapted to engage said heads, whereby said heads press said ring toward said module when said cam member is turned, compress said ring, and press said module toward said substrate to maintain contact between contacts on said module and contacts in said first array of interposer contacts, to maintain contact between said contacts in said second array of interposer contacts and contacts on said substrate, and thereby maintain electrical connections between said module and said substrate;
   said posts, substrate locator holes, interposer locator holes and module locator holes being adapted to maintain said substrate, interposer and registration sheet in alignment when said ring is turned to compress said spring and press said integrated circuit module toward said printed circuit board or card.

2. An interconnect assembly according to claim 1 wherein said substrate comprises a printed circuit board or card.

3. An interconnect assembly according to claim 1, wherein said module contacts comprise solder balls or columns.

4. An interconnect assembly according to claim 1 wherein each of said arcuate openings has a first inclined ramp and a second inclined ramp adjacent to said first inclined ramp and sloping in the opposite direction from said first inclined ramp, with an apex between said first inclined ramp and said second inclined ramp, whereby said ring is pressed toward said substrate as said heads move along said first inclined ramps and said ring is held in place by said second inclined ramps after said heads move past said apices.

5. An interconnect assembly according to claim 4 wherein each of said heads has a first inclined ramp that has substantially the same slope as the first inclined ramps on said ring and a second inclined ramp that has substantially the same slope as said second inclined ramps on said ring.

6. An interconnect assembly according to claim 1 further comprising a registration sheet adapted to position said first component so that the contacts in the first array are aligned with contacts in said second array, said registration sheet having two or more locator holes that are substantially the same size, and a polarization hole that is of a different size than said locator holes, wherein:

said substrate has two or more locator holes that are substantially the same size as the locator holes in the registration sheet, and a polarization hole that is substantially the same size as the polarization hole in the registration sheet; and said posts on said base include two or more locator posts that extend through the locator holes on the second component and the locator holes on the registration sheet, and a polarization post that extends through the locator hole on the second component and through the polarization holes on the registration sheet, each of the locator posts comprises a base that is substantially the same size as said locator holes and said polarization post has a base that is substantially the same size as said polarization holes;

each of said posts has a neck and a head;

the necks of the locator posts and the necks of the polarization post are substantially the same size;

the heads of the locator post and the head of the polarization post are substantially the same size, and are larder that said necks; and said cam member comprises a ring having arcuate openings with inclined ramps adapted to engage said heads, whereby said heads press said ring toward said substrate.

7. An interconnect assembly according to claim 6 wherein each of said arcuate openings has a first inclined ramp and a second inclined ramp adjacent to said first inclined ramp and sloping in the opposite direction from said first inclined ramp, with an apex between said first inclined ramp and said second inclined ramp, whereby said ring is pressed toward said substrate as said heads move along said first inclined ramps and said ring is held in place by said second inclined ramps after said heads move past said apices.

8. An interconnect assembly according to claim 7 wherein each of said heads has a first inclined ramp that has substantially the same slope as the first inclined ramps on said ring and a second inclined ramp that has substantially the same slope as said second inclined ramps on said ring.

9. An inter connect assembly according to claim 1 wherein said interposer comprises a sheet of dielectric material having vias extending through said sheet and connecting contacts in said first array with contacts in said second array.

10. An interconnect assembly according to claim 1 wherein said interposer comprises a first sheet of dielectric material, a second sheet of dielectric material spaced from said first sheet, and vias extending through said first sheet and said second sheet and connecting contacts in said first array with contacts in said second array.

11. An interconnect assembly according to claim 1 wherein said interposer comprises a buckling beam connector having flexible beams of dielectric material, said beams supporting strips of conductive material that connect contacts in said first array with contacts in said second array.

12. Apparatus for electrically interconnecting an integrated circuit module having ball grid array or column grid array connectors with a printed circuit board or card having substrate locator holes extending therethrough, comprising;

a subassembly comprising:
said printed circuit board or card;
an electrical interposer, having a first array of contacts distributed over a first surface of said interposer and a second array of contacts distributed over a second surface of said interposer opposite said first surface, with contacts in said first array being substantially aligned with and electrically connected directly through said interposer to contacts in said second array;

a base having posts adapted to extend through said substrate locator holes and through said interposer locator holes and thereby align contacts in said second array of interposer contacts with contacts on said printed circuit board or card;

a registration sheet having module locator holes adapted to engage said posts and secure said registration sheet, said interposer and said printed circuit board or card on said base, said registration sheet being adapted to align balls or columns on said integrated circuit module with electrical contacts in said first array of interposer contacts;

a kit for connecting said integrated circuit module to said subassembly, comprising:
a cam member adapted to connect to said posts, with said IC module positioned between said printed circuit board or card and said cam member;

a pressure member adapted to bias said IC module toward said printed circuit board or card; and a wave spring comprising a metallic annular ring having a serpentine radial cross-section and adapted to contact said cam member and said pressure member at a plurality of locations around said ring, to transmit pressure from said cam member to said pressure member, and to compensate for dimensional variations and deviations from planarity.

13. Apparatus in accordance with claim 12 wherein said posts have grooves, and said registration member has one or more tabs adapted to engage said grooves and secure said base and said registration member on said printed circuit board or card.

14. Apparatus according to claim 12 wherein said registration member comprises one or more tabs with an adhesive coating adapted to hold said module in position on said registration member so that said module and said registration member can be preassembled.

15. A method for electrically interconnecting an integrated circuit module having an array of contacts distributed over a surface of said module to a printed circuit board or card having an array of contacts distributed over a surface of said module, and having substrate locator holes extending therethrough, comprising;

preassembling said printed circuit board or card; an electrical interposer having a first array of contacts distributed over a first surface of said interposer, a second array of contacts distributed over a second surface of said interposer opposite said first surface, and interposer locator holes extending through said interposer; a base having posts adapted to extend through said substrate locator holes and through said interposer locator holes; and a registration member sheet having locator holes adapted to mate with said posts, said registration sheet being adapted to align contacts on said integrated circuit module with electrical contacts in said second array of interposer contacts; and providing a kit for connecting said integrated circuit module to said preassembled printed circuit board or card. interposer, registration sheet and base, comprising:

a cam member adapted to connect to said posts, with said IC module positioned between said printed circuit board and card and said cam member;

a pressure member adapted to bias said IC module toward said printed circuit board and card; and a wave spring comprising a metallic annular ring having a serpentine radial cross-section and adapted to contact said cam member and said pressure member at a plurality of locations around said ring, to transmit pressure from said cam member to said pressure member, and to compensate for dimensional variations and deviations from planarity.

16. A method according to claim 15 wherein said posts have grooves, and said registration member has one or more tabs adapted to engage said grooves and secure said base and said registration member on said printed circuit board or card.

17. A method according to claim 15 wherein said registration member comprises one or more tabs with an adhesive coating adapted to hold said module in position on said registration member so that said module and said registration member can be preassembled.

* * * * *